(12) United States Patent
Nakano et al.

(10) Patent No.: US 10,505,081 B2
(45) Date of Patent: Dec. 10, 2019

(54) LIGHT EMITTING DEVICE

(71) Applicant: NICHIA CORPORATION, Anan-shi, Tokushima (JP)

(72) Inventors: Makoto Nakano, Anan (JP); Kenji Nakata, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/027,223

(22) Filed: Jul. 3, 2018

(65) Prior Publication Data

US 2019/0013448 A1    Jan. 10, 2019

(30) Foreign Application Priority Data

Jul. 4, 2017 (JP) ................... 2017-130744

(51) Int. Cl.
    *H01L 33/50* (2010.01)
    *C09K 11/77* (2006.01)
    (Continued)

(52) U.S. Cl.
    CPC ........ *H01L 33/504* (2013.01); *C09K 11/0883* (2013.01); *C09K 11/665* (2013.01);
    (Continued)

(58) Field of Classification Search
    CPC ... H01L 33/504; H01L 33/507; H01L 33/505; H01L 33/62; H01L 33/486;
    (Continued)

(56) References Cited

U.S. PATENT DOCUMENTS 8,884,512 B2 * 11/2014 Yamakawa .......... C09K 11/665
                                                        252/301.4 R
10,141,484 B2 * 11/2018 Asai ..................... H01L 33/504
(Continued)

FOREIGN PATENT DOCUMENTS

JP    2003535477 A    11/2003
JP    2007103512 A    4/2007
(Continued)

*Primary Examiner* — Victor A Mandala
(74) *Attorney, Agent, or Firm* — Hunton Andrews Kurth LLP (57) ABSTRACT

A light emitting device, comprising a light emitting element having a peak emission wavelength in a range of from 440 nm to 460 nm, and a phosphor member. The phosphor member contains: a first phosphor having a peak emission wavelength in a range of from 440 nm to 550 nm and comprising at least one selected from the group consisting of an Eu-activated alkaline earth aluminate or an Eu-activated silicate containing Ca, Mg, and Cl; a second phosphor having a peak emission wavelength in a range of from 500 nm to 600 nm and comprising a Ce-activated rare earth aluminate; a third phosphor having a peak emission wavelength in a range of from 610 nm to 650 nm and comprising an Eu-activated silicon nitride containing Al and at least one selected from the group consisting of Sr and Ca; and a fourth phosphor having a peak emission wavelength in a range of from 650 nm to 670 nm and comprising a Mn-activated fluorogermanate.

20 Claims, 7 Drawing Sheets

(51) Int. Cl.
  *C09K 11/08* (2006.01)
  *C09K 11/66* (2006.01)
  *H01L 33/48* (2010.01)
  *H01L 33/62* (2010.01)
(52) U.S. Cl.
  CPC ...... *C09K 11/7707* (2013.01); *C09K 11/7734* (2013.01); *C09K 11/7774* (2013.01); *H01L 33/505* (2013.01); *H01L 33/507* (2013.01); *H01L 33/486* (2013.01); *H01L 33/62* (2013.01)
(58) Field of Classification Search
  CPC ............ C09K 11/7774; C09K 11/7707; C09K 11/665; C09K 11/0883; C09K 11/7734
  See application file for complete search history.

(56) References Cited

U.S. PATENT DOCUMENTS

| | | | |
|---|---|---|---|
| 2003/0006469 A1 | 1/2003 | Ellens et al. | |
| 2003/0146690 A1 | 8/2003 | Ellens et al. | |
| 2005/0104503 A1 | 5/2005 | Ellens et al. | |
| 2006/0103291 A1 | 5/2006 | Ellens et al. | |
| 2009/0224177 A1 | 9/2009 | Kinomoto et al. | |
| 2012/0087116 A1 | 4/2012 | Tukker et al. | |
| 2012/0092864 A1 | 4/2012 | Kurt et al. | |
| 2013/0257266 A1* | 10/2013 | Ishizaki | H01L 33/504 313/503 |
| 2014/0022780 A1 | 1/2014 | Roberge et al. | |
| 2014/0362885 A1* | 12/2014 | Sakuta | H01L 33/50 372/47.01 |
| 2016/0218255 A1 | 7/2016 | Kim | |
| 2017/0054059 A1 | 2/2017 | Hosokawa et al. | |
| 2017/0179347 A1 | 6/2017 | Asai | |
| 2017/0345976 A1 | 11/2017 | Asai | |

FOREIGN PATENT DOCUMENTS

| | | |
|---|---|---|
| JP | 2008034188 A | 2/2008 |
| JP | 2009206459 A | 9/2009 |
| JP | 2011243963 A | 12/2011 |
| JP | 2012530338 A | 11/2012 |
| JP | 2014513399 A | 5/2014 |
| JP | 2016111190 A | 6/2016 |
| JP | 2017041629 A | 2/2017 |
| JP | 6148395 B2 | 6/2017 |
| JP | 2017117875 A | 6/2017 |
| JP | 2017216438 A | 12/2017 |

* cited by examiner

LIGHT EMITTING DEVICE

CROSS-REFERENCE TO RELATED APPLICATION

This application claims priority to Japanese Patent Application No. 2017-130744, filed on Jul. 4, 2017, the disclosure of which is hereby incorporated by reference in its entirety.

BACKGROUND

The present disclosure relates to a light emitting device.

As a white light emitting device employing a light emitting diode (hereinafter also referred to as "LED"), there is, for example, a light emitting device in which a blue light emitting LED and a yellow light emitting phosphor are combined. This light emitting device emits white light by combining the blue light from the LED with the yellow light from the phosphor that is excited by the blue light. Such a light emitting device can have high emission intensity and high emission efficiency in the visible light spectrum, but might not have sufficient emission intensity in the blue-green region and the red region. For this reason, there is room for improvement in how the color of an illuminated object appears (hereinafter referred to as "color rendering properties").

Here, the evaluation procedure for the color rendering properties of a light source is specified by JIS Z8726 where the test colors (R1 to R15) having prescribed reflectance characteristics are measured using a test light source and a reference light source, and numeric calculations of the color differences $\Delta Ei$ (i is an integer 1 to 15) are performed to obtain the color rendering indexes. The upper limit of a color rendering index Ri ("i" is an integer 1 to 15) is 100. That is, the smaller the color difference between the test light source and the reference light source having the corresponding color temperature is, the higher and closer to 100 the color rendering index results. Among the color rendering indexes, the average of the values for R1 to R8 is referred to as the average color rendering index (hereinafter also referred to as Ra), and R9 to R15 are referred to as special color rendering indexes. R9 is defined as red, R10 yellow, R11 green, R12 blue, R13 the skin color of a westerner, R14 the color of leaves, and R15 the skin color of a Japanese person.

In order to enhance the color rendering properties of a light source, for example, Japanese Unexamined Patent Application Publication No. 2003-535477 proposes a light emitting device having an LED which emits blue light and two phosphors which emit green to yellow light, such as chlorosilicate phosphor and Y or Tb garnet phosphor. Moreover, in order to further enhance the color rendering properties, for example, Japanese Unexamined Patent Application Publication No. 2008-034188 proposes a light emitting device employing a phosphor which emits red light in addition to a phosphor that emits green to yellow light.

SUMMARY

In the case of a conventional light emitting device, the employment of phosphors emitting, for example, yellow, green, and red light make it possible to reduce the color differences in the corresponding wavelength regions to some extent. However, it is difficult to bring the emission intensity in the blue region primarily dependent on the light emitting element close to that of the reference light source, to thereby reduce the color difference in the blue region. Adjusting the amount of a phosphor or adding a diffuser, for example, can conceivably adjust the blue emission intensity. The effort, however, has not achieved a satisfactory solution. Here, emission in the blue wavelength region is largely involved in the color rendering index R12 in general, and a conventional light emitting device tends to have a low R12 value. In order to achieve a light emitting device having good color rendering properties, it needs to increase the R12 value by constructing the light emitting device to achieve a series of continuous emission spectrum in the visible light region, such as from purple to blue, from green to yellow, and from orange to red, similar to sunlight.

Examples of the light emitting devices that can address these actual cases include one that employs a light emitting element having a peak emission wavelength in the near ultraviolet region which does not contribute to the calculation of the color rendering index. However, light in the near ultraviolet region has a high content of ultraviolet components which raises problems of not only adversely affecting the human body and objects, but also degrading the light emitting device components and considerably reducing the emission efficiency of the light emitting device.

Accordingly, one object of one embodiment of the present disclosure is to address the actual cases described above and provide a light emitting device having good color rendering properties.

A light emitting device according to the present disclosure includes a light emitting element having a peak emission wavelength in a range of from 440 nm to 460 nm, and a phosphor member which includes a first phosphor, a second phosphor, a third phosphor and a fourth phosphor. The first phosphor has a peak emission wavelength in a range of from 440 nm to 550 nm, and comprises at least one selected from the group consisting of an Eu-activated alkaline earth aluminate and an Eu-activated silicate containing Ca, Mg, and Cl. The second phosphor has a peak emission wavelength in a range of from 500 nm to 600 nm, and comprises a Ce-activated rare earth aluminate. The third phosphor has a peak emission wavelength in a range of from 610 nm to 650 nm, and comprises an Eu-activated silicon nitride containing Al and at least one selected from the group consisting of Sr and Ca. The fourth phosphor has a peak emission wavelength in a range of from 650 nm to 670 nm, and comprises a Mn-activated fluorogeimanate.

According to the embodiment of the present disclosure, a light emitting device having good color rendering properties can be provided.

DESCRIPTION

Certain embodiments of the present disclosure will be explained below. The embodiments described below, however, are illustrations of the light emitting devices for the purpose of giving shapes to the technical ideas of the present disclosure, and the present disclosure is not limited to these light emitting devices. The relationships between the color names and chromaticity coordinates, the relationships between the wavelength ranges and the color names of monochromatic light, and the like are in accordance with JIS Z8110. When multiple substances constituting the component are present in the composition, the content of each component in a composition represents a total content of the multiple substances present in the composition.

Light Emitting Device

Figure 1:
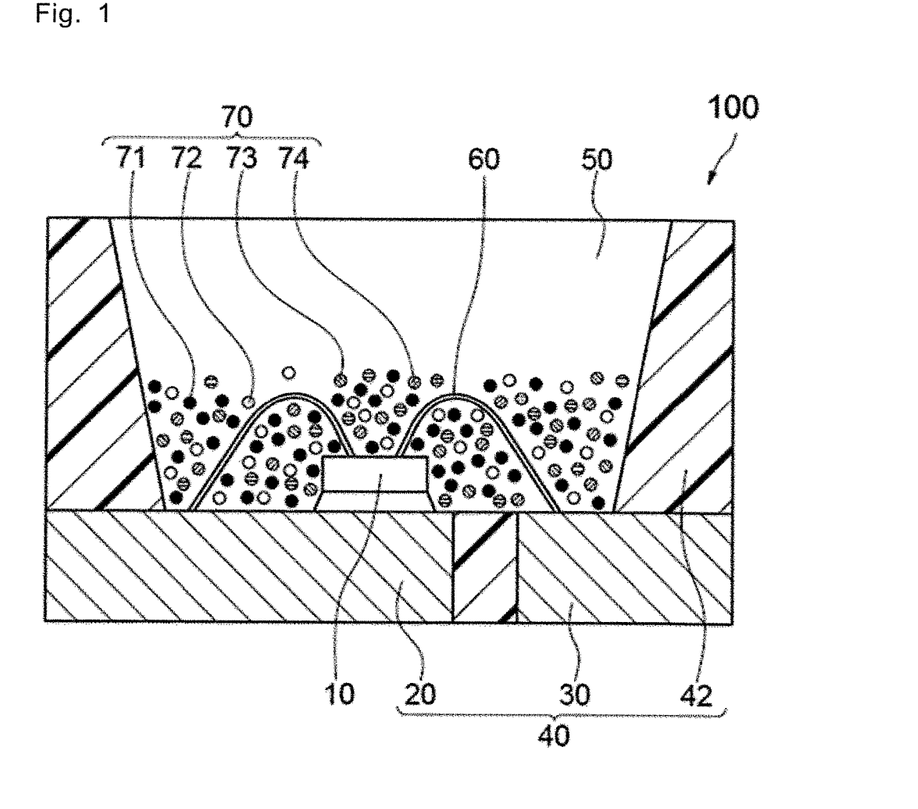
FIG. 1 is a schematic sectional view of a light emitting device according to the present disclosure.

FIG. 1 is a schematic sectional view of the light emitting device according to one embodiment of the present disclosure. The light emitting device 100 includes a light emitting element 10 having a peak emission wavelength in a range of from 440 nm to 460 nm and a phosphor member 50. The phosphor member 50 includes at least four types of phosphors as phosphors 70: a first phosphor 71, a second phosphor 72, a third phosphor 73, and a fourth phosphor 74. The first phosphor 71 has a peak emission wavelength in a range of from 440 nm to 550 nm, and comprises at least one selected from the group consisting of an Eu-activated alkaline earth aluminate and an Eu-activated silicate containing Ca, Mg, and Cl. The second phosphor 72 has a peak emission wavelength in a range of from 500 nm to 600 nm and comprises a Ce-activated rare earth aluminate. The third phosphor 73 has a peak emission wavelength in a range of from 610 nm to 650 nm, and comprises an Eu-activated silicon nitride containing Al and at least one selected from the group consisting of Sr and Ca. The fourth phosphor 74 has a peak emission wavelength in a range of from 650 nm to 670 nm, and comprises a Mn-activated fluorogermanate. The content of the first phosphor 71 relative to the total content of the phosphors 70 in the phosphor member 50 is preferably in a range of from 10 mass percent to 60 mass percent, more preferably in a range of from 15 mass percent to 40 mass percent.

The light emitting device 100 includes the light emitting element 10 having a specific peak emission wavelength and at least four specific types of phosphors. Accordingly, the emission spectrum of the light emitting device 100 can become close to the spectrum of the reference light source over an extremely broad range of the visible light region from the short wavelength side to the long wavelength side relevant to the calculations of the color rendering indexes This makes it possible to achieve good color rendering properties. Moreover, the light emitting device can achieve high emission efficiency as a light source by including a light emitting element 10 having an emission peak in a specific wavelength range. The special color rendering index R12, in particular, can be improved by including a specific light emitting element 10 and a phosphor member 50 which contains a specific amount of the first phosphor 71.

With respect to the average color rendering index Ra, the CIE (International Commission on Illumination) released in 1986 guidelines for the color rendering properties a fluorescent lamp should have. According to the guidelines, preferable average color rendering index Ra depending on the location is specified. The preferable average color rendering index Ra for factories that perform general work should be from 60 or more and less than 80, for residences, hotels, restaurants, shops, offices, schools, hospitals, and factories that perform precision work should be 80 or more and less than 90, and for clinical laboratories and museums which require a high color rendering level should be at least 90.

The Ra of the light emitting device 100 according to this embodiment, for example, is at least 80, preferably at least 90, more preferably at least 95. Each special color rendering index R9 to R15 of the light emitting device 100, for example, is at least 50, preferably at least 70, more preferably at least 90. Particularly, the R12 is, for example, at least 60, preferably at least 80, more preferably at least 90. The total of the special color rendering indexes R9 to R15 (hereinafter referred also as Rt) is, for example, at least 570, preferably at least 600, more preferably at least 650.

The light emitted from the light emitting device 100 is a mixture of the light from the light emitting element 10 and the fluorescence from the first phosphor 71, the second phosphor 72, the third phosphor 73, and the fourth phosphor 74, and can be set, for example, to the light having the chromaticity coordinates specified by CIE 1931 with x in a range of from 0.00 to 0.60 and y in a range of from 0.00 to 0.50, or x in a range of from 0.25 to 0.50 and y in a range of from 0.25 to 0.50. The correlated color temperature of the light emitted from the light emitting device 100 is, for example, at least 2000 K or at least 2500 K, and 7500 K at most or 7000 K at most.

The light emitting device 100 according to this embodiment will be explained in detail based on FIG. 1. The light emitting device 100 is an example of a surface-mount light emitting device.

The light emitting device 100 shown in FIG. 1 emits light at shorter wavelength side of the visible light spectrum, e.g., in a range of from 380 nm to 485 nm, and has a gallium nitride-based compound semiconductor light emitting element 10 having a peak emission wavelength in the range of from 440 nm to 460 nm and a package 40 in which the light emitting element 10 is mounted. The package 40 is made, for example, by integrally forming a first lead 20, a second lead 30, and a resin part 42. A ceramic material, instead of the resin part 42, may be used to form the package 40 by employing a known method. The package 40 has a recess having a bottom face and lateral faces, and the light emitting element 10 is mounted on the bottom face of the recess. The light emitting element 10 has a pair of positive and negative electrodes, and the pair of positive and negative electrodes are electrically connected to the first lead 20 and the second lead 30, respectively, via wires 60. The light emitting element 10 is covered by the phosphor member 50. The phosphor member 50, for example, comprises a resin part and at least four phosphors for converting the wavelengths of the emitted light from the light emitting element 10, i.e., the first phosphor 71, the second phosphor 72, the third phosphor 73, and the fourth phosphor 74.

Light Emitting Element 10

The peak emission wavelength of the light emitting element 10 is in the range of from 440 nm to 460 nm, preferably in the range of from 445 nm to 455 nm in the emission efficiency standpoint. Using a light emitting element 10 having a peak emission wavelength in these ranges as the excitation light source enables the construction of a light emitting device 100 that emits light which is a mixture of the light from the light emitting element 10 and light from the fluorescence from the phosphors 70. The emitted light from the light emitting element 10 can be efficiently utilized, thereby enabling reduction in loss of the light exiting from the light emitting device 100, a highly efficient light emitting device 100 can be produced.

The full width at half maximum of the light emitting element 10 can be set, for example, to 30 nm at most.

For the light emitting element 10, a semiconductor light emitting element such as an LED is preferably used. Using a semiconductor light emitting element as the light source can achieve a light emitting device 100 which is highly efficient with high input to output linearity and stable that is resistant to mechanical shocks.

For the semiconductor light emitting element, for example, a blue light emitting semiconductor light emitting element employing, for example, a nitride-based semiconductor ($In_XAl_YGa_{1-X-Y}N$ where X and Y satisfy $0 \leq X$, $0 \leq Y$, and $X+Y \leq 1$) can be used. The light emitting device 100 can include at least one light emitting element 10, but may include two or more light emitting elements 10, or a light emitting element 10 in combination with another light emitting element having a different peak emission wavelength from that of the light emitting element 10.

Phosphor Member 50

The phosphor member 50, for example, can include phosphors 70 and a resin part. The phosphor member 50 includes the phosphors 70 in which at least one type of the first phosphor 71, at least one type of the second phosphor 72, at least one type of the third phosphor 73 and at least one type of the fourth phosphors 74. At least one type of the first phosphor 71 emits blue to green light, at least one type of the second phosphor 72 emits yellow light, at least one type of the third phosphor 73 emits red light, and at least one type of the fourth phosphor 74 emits deep red light, by respectively absorbing the light emitted from the light emitting element 10. The first phosphor 71 to the fourth phosphor 74 have compositions that are different from one another. By suitably selecting the composition ratio of the first phosphor 71 to the fourth phosphor 74, the characteristics of the light emitting device 100, such as the emission efficiency and color rendering properties, can be set within desired ranges.

First Phosphor 71

Conventionally light emission intensity in the blue region is dependent only on the light source, however, incorporating the first phosphor 71 emitting blue to green light in the light emitting device 100 can more easily bring the emission intensity in the blue region close to that of the reference light source. This can improve the color rendering properties of the light emitting device 100.

The first phosphor 71 is a green light emitting phosphor having a peak emission wavelength in the range of from 440 nm to 550 nm, and containing either an Eu-activated alkaline earth aluminate or an Eu-activated silicate in which Ca, Mg, and Cl are present in the composition. The first phosphor 71 preferably contains at least an alkaline earth aluminate. The alkaline earth aluminate preferably has, for example, the composition expressed by the formula (1a) below, more preferably has the composition expressed by the formula (1a') below. Silicate preferably has, for example, the composition expressed by the formula (1b) below, more preferably has the composition expressed by the formula (1b') below. The first phosphor 71 can relatively easily achieve the emission properties explained below by having a specific composition.

$(Sr,Ca,Ba)_4Al_{14}O_{25}:Eu$         (1a)

$Sr_4Al_{14}O_{25}:Eu$         (1a')

$(Ca,Sr,Ba)_8MgSi_4O_{16}(F,Cl,Br)_2:Eu$         (1b)

$Ca_8MgSi_4O_{16}Cl_2:Eu$         (1b')

When the first phosphor 71 has the composition expressed by the formula (1b), the first phosphor 71 contains at least one selected from the group consisting of Ca, Sr, and Ba. The first phosphor 71 preferably contains at least Ca, and more preferably has the Ca content of at least 90 mole percent relative to the total content of Ca, Sr, and Ba. The first phosphor 71 may contain at least one selected from the group consisting of F, Cl and Br. The first phosphor 71 preferably contains at least Cl, more preferably has the Cl content of at least 90 mole percent relative to the total content of F, Cl, and Br.

The maximum excitation wavelength of the first phosphor 71 is, for example, in a range of from 270 nm to 470 nm, preferably from 370 nm to 460 nm. This allows for efficient excitation in the peak emission wavelength range of the light emitting element 10.

When the first phosphor 71 has the composition expressed by the formula (1a), the peak emission wavelength is, for example, in a range of from 440 nm to 550 nm, preferably from 460 nm to 530 nm. The full width at half maximum in the emission spectrum is, for example, in a range of from 58 nm to 78 nm, preferably from 63 nm to 73 nm.

When the first phosphor 71 has the composition expressed by the formula (1b), the peak emission wavelength is, for example, in a range of from 510 nm to 540 nm, preferably from 520 nm to 530 nm. The full width at half maximum in the emission spectrum range, for example, in a range of from 50 nm to 75 nm, preferably from 58 nm to 68 nm.

Using at least one of such first phosphor 71 can improve the color purity to thereby bring the emission spectrum in the blue to green region closer to that of the reference light source, and further improve the color rendering properties of the light emitting device 100.

In the case of a light emitting device 100 that emits light having a correlated color temperature of from 2000 K to 7500 K, for example, the first phosphor 71 content relative to the total content of the phosphors in the phosphor member 50 (i.e., the first phosphor content/total phosphor content; hereinafter also simply referred to as "first phosphor 71 content") is at least 10 mass percent, preferably at least 15 mass percent, more preferably at least 20 mass percent. Moreover, the first phosphor 71 content is 50 mass percent at most, preferably 40 mass percent at most, more preferably 35 mass percent at most. Furthermore, the content of the first phosphor 71 relative to the entire phosphor member 50 (i.e., mass of the first phosphor/mass of phosphor member) is in a range of from 10 mass percent to 50 mass percent, preferably from 25 mass percent to 40 mass percent.

In the case of a light emitting device 100 that emits light having a correlated color temperature in a range of from 2500 K to 3500 K, for example, the first phosphor 71 content is at least 10 mass percent, preferably at least 15 mass percent, more preferably at least 20 mass percent. Moreover, the first phosphor 71 content is 30 mass percent at most, preferably 25 mass percent at most, more preferably 23 mass percent at most.

Figure 2A:
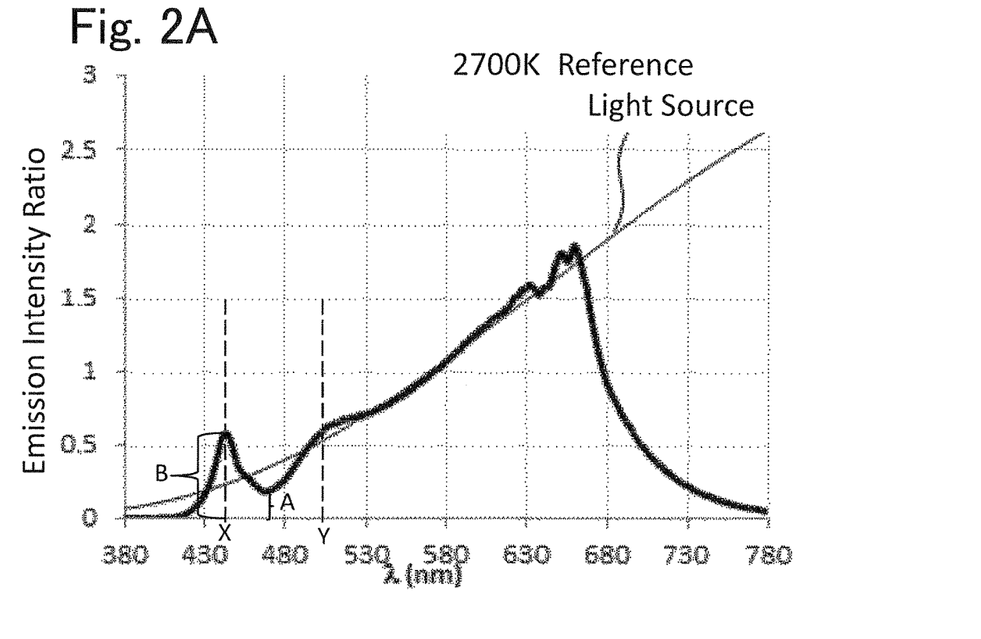
FIG. 2A shows an example of the emission spectrum of a light emitting device according to the present disclosure.

FIG. 2A shows an example of the emission spectrum of a light emitting device 100. As shown in FIG. 2A, in the case of a light emitting device 100 having a correlated color temperature in the range of from 2500 K to 3500 K, a ratio of a peak emission intensity of the first phosphor 71 to a peak emission intensity of the light emitting element 10 in the emission spectrum is preferably in a range of from 0.9 to 1.15. Setting the first phosphor 71 content and the peak emission intensity within a ranges described above can bring the emission spectrum of the light emitting device 100 in the blue to green region closer to that of the reference light source, thereby further improving the color rendering properties.

In the case of a light emitting device 100 that emits light having a correlated color temperature of at least 4500 K but lower than 5500 K, for example, the first phosphor 71 content is at least 15 mass percent, preferably at least 20 mass percent, more preferably at least 30 mass percent. Moreover, the first phosphor 71 content is 50 mass percent at most, preferably 40 mass percent at most, more preferably 35 mass percent at most.

Figure 2B:
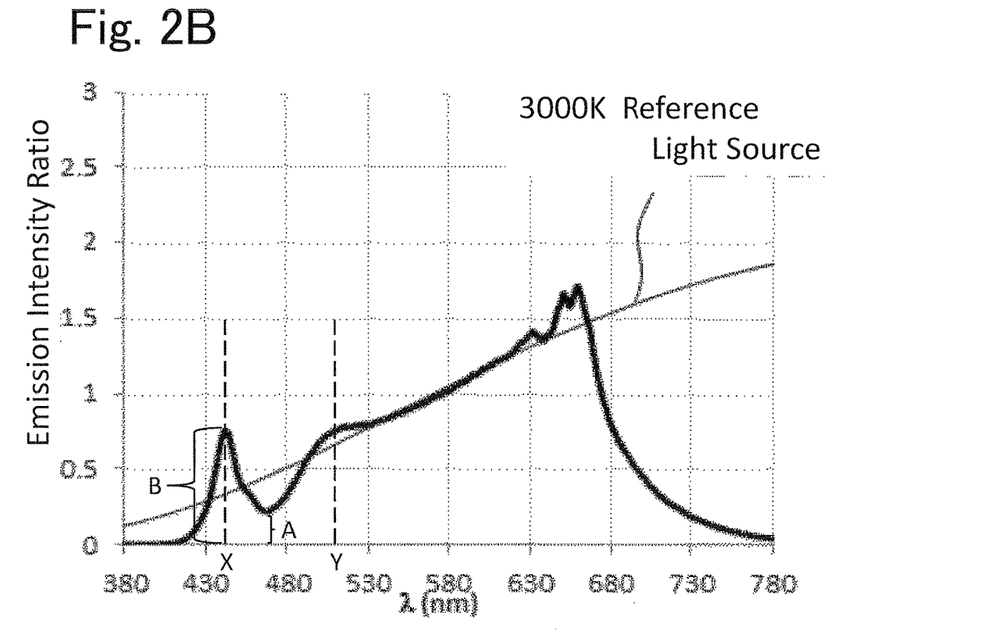
FIG. 2B shows an example of the emission spectrum of a light emitting device according to the present disclosure.
Figure 2C:
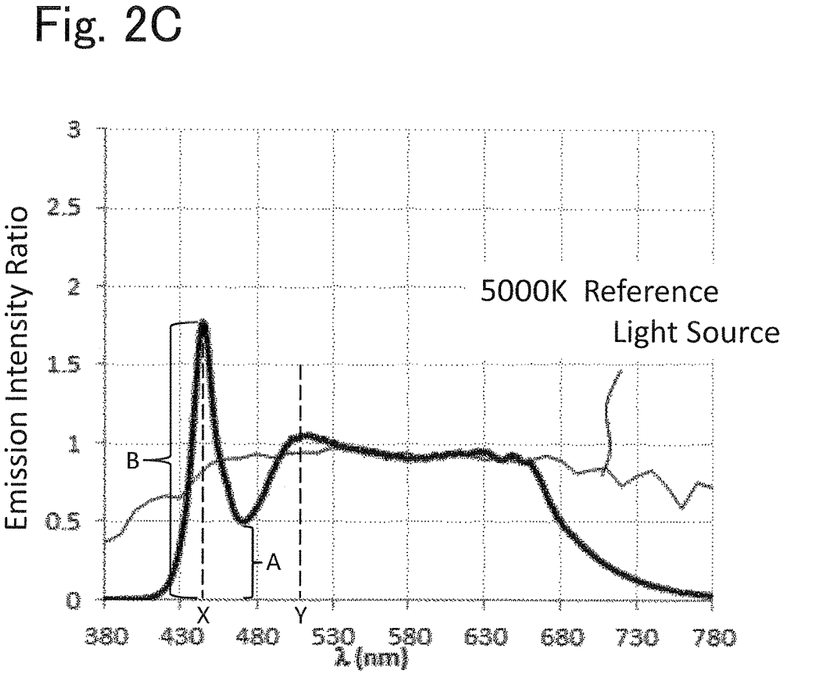
FIG. 2C shows an example of the emission spectrum of a light emitting device according to the present disclosure.

FIGS. 2B and 2C show examples of the light emitting spectrum of light emitting devices 100. As shown in FIGS. 2B and 2C, when a light emitting device 100 emits light having a correlated color temperature ranging from 4500 K to 5500 K, a ratio of a peak emission intensity of the first phosphor 71 to a peak emission intensity of the light emitting element 10 is preferably 0.6 at most. Setting the first phosphor 71 content and the peak emission intensity within a ranges described above can bring the emission spectrum of the light emitting device 100 in the blue to green region closer to that of the reference light source, thereby further improving the color rendering properties.

As shown in FIGS. 2A to 2C, in the case of a light emitting device 100 having a correlated color temperature in the range of from 2500 K to 5500 K, in the emission spectrum of the light emitting device, a ratio (A/B) of a lowest emission intensity A to a peak emission intensity B at a wavelength corresponding to a emission peak wavelength of the light emitting element 10 in the region between the wavelength X and a wavelength Y corresponding to the emission peak wavelength of the first phosphor 71 preferably ranges from 0.2 to 0.27. This can bring the emission spectrum of the light emitting device 100 in the blue to green region closer to that of the reference light source, thereby further improving the color rendering properties.

Second Phosphor 72

The second phosphor 72 is a yellow light emitting phosphor having a peak emission wavelength in a range of from 500 nm to 600 nm and containing a Ce-activated rare earth aluminate. The second phosphor 72 preferably has the composition expressed by the formula (2) below, more preferably the composition expressed by the formula (2') below. This makes it possible to relatively easily achieve the emission properties of the second phosphor 72 described below.

$$(Y,Lu,Gd)_3(Al,Ga)_5O_{12}:Ce \qquad (2)$$

$$Y_3Al_5O_{12}:Ce \qquad (2')$$

The maximum excitation wavelength of the second phosphor 72 is, for example, in a range of from 220 nm to 490 nm, preferably from 430 nm to 470 nm. This allows for efficient excitation in the peak emission wavelength range of the light emitting element 10. The peak wavelength of the second phosphor 72 is, for example, in a range of from 480 nm to 630 nm, preferably from 500 nm to 560 nm. These ranges can reduce the overlap with the emission spectrum of the second phosphor 72, thereby bringing the emission spectrum in the yellow region closer to that of the reference light source, and further improving the color rendering properties of the light emitting device 100. The full width at half maximum in the emission spectrum of the second phosphor 72 is, for example, in a range of from 95 nm to 115 nm, preferably from 100 nm to 110 nm. Setting the full width at half maximum in this range can improve the color purity to thereby bring the emission spectrum in the yellow region closer to that of the reference light source and further improve the color rendering properties of the light emitting device 100.

In the case of a light emitting device 100 that emits light having a correlated color temperature of in a range of from 2000 K to 7500 K, for example, the second phosphor 72 content relative to the total content of the phosphors in the phosphor member 50 (i.e., the second phosphor content/total phosphor content; hereinafter also simply referred to as "second phosphor 72 content") is at least 15 mass percent, preferably at least 20 mass percent, more preferably at least 25 mass percent. Moreover, the second phosphor 72 content is, for example, 60 mass percent at most, preferably 50 mass percent at most, more preferably 45 mass percent at most. Furthermore, the content of the second phosphor 72 relative to the entire phosphor member 50 (i.e., mass of the second phosphor/mass of phosphor member) is in a range of from 10 mass percent to 80 mass percent, preferably from 20 mass percent to 70 mass percent.

In the case of a light emitting device 100 that emits light having a correlated color temperature in a range of from 2500 K to 3500 K, for example, the second phosphor 72 content is, for example, at least 20 mass percent, preferably at least 30 mass percent, more preferably at least 35 mass percent. Moreover, the second phosphor 72 content is, for example, 55 mass percent at most, preferably 50 mass percent at most, more preferably 45 mass percent at most.

In the case of a light emitting device 100 that emits light having a correlated color temperature of at least 4500 K but lower than 5500 K, for example, the second phosphor 72 content is at least 15 mass percent, preferably at least 20 mass percent, more preferably at least 25 mass percent. Moreover, the second phosphor 72 content is, for example, 40 mass percent at most, preferably 35 mass percent at most, more preferably 30 mass percent at most.

Setting the second phosphor 72 content in a ranges described above can bring the emission spectrum of the light emitting device 100 in the yellow region closer to that of the reference light source, thereby further improving the color rendering properties.

Third Phosphor 73

The third phosphor 73 is a red light emitting phosphor having a peak emission wavelength in the range of from 610 nm to 650 nm and containing an Eu-activated silicon nitride in which Al and at least one selected from the group consisting of Sr and Ca are present in the composition. The third phosphor 73, for example, preferably has the composition expressed by the formula (3) below. In this way, the emission properties of the third phosphor 73 described below can be relatively easily achieved.

$$(Sr,Ca)AlSiN_3:Eu \qquad (3)$$

When the third phosphor 73 has the composition expressed by the formula (3), the third phosphor 73 contains at least one selected from the group consisting of Sr and Ca. The third phosphor 73 preferably contains both Sr and Ca with the Sr content of at least 0.8 mole percent. This allows the peak emission wavelength of the third phosphor 73 to be within a desired range.

The peak emission wavelength of the third phosphor 73 is, for example, in a rage of from 620 nm to 650 nm, preferably from 630 nm to 645 nm. When the peak emission wavelength of the third phosphor 73 is equal to or higher than the lower limit value, there is no emission intensity deficiency between a peak emission wavelength of the fourth phosphor 74 described below and the peak emission wavelength of the third phosphor 73, and the emission spectrum in the red region can be brought closer to that of the reference light source. When the peak emission wavelength of the third phosphor 73 is equal to or lower than the upper limit value, the overlap between the emission spectrum of the third phosphor 73 and the emission spectrum of the fourth phosphor 74 can be reduced to efficiently achieve the effect of the emission spectrum of the fourth phosphor 74. Thus, the color rendering properties can be further improved. The full width at half maximum in the emission spectrum of the third phosphor 73 is, for example, in a range of from 80 nm to 100 nm, preferably from 85 nm to 95 nm. Setting the full width at half maximum in these ranges can reduce the overlap between the emission spectrum of the third phosphor 73 and the emission spectrum of the fourth phosphor 74, thereby efficiently achieving the effect of the emission spectrum of the fourth phosphor 74 and further improving the color rendering properties.

In the case of a light emitting device 100 that emits light having a correlated color temperature in a range of from 2000 K to 7500 K, for example, the third phosphor 73 content relative to the total content of the phosphors in the phosphor member 50 (i.e., the third phosphor content/total phosphor content; hereinafter also simply referred to as "third phosphor 73 content") is at least 0.5 mass percent, preferably at least 1 mass percent, more preferably at least 3 mass percent. Moreover, the third phosphor 73 content is, for example, 10 mass percent at most, preferably 8 mass percent at most. Furthermore, the content of the third phosphor 73 relative to the entire phosphor member 50 (i.e., mass of the third phosphor/mass of phosphor member) is in a range of from 1 mass percent to 15 mass percent, preferably from 3 mass percent to 10 mass percent.

In the case of a light emitting device 100 that emits light having a correlated color temperature is in a range of from 2500 K to 3500 K, for example, the third phosphor 73 content is, for example, at least 1 mass percent, preferably at least 1.5 mass percent, more preferably at least 3 mass percent. Moreover, the third phosphor 73 content is, for example, 10 mass percent at most, preferably 8 mass percent at most.

In the case of a light emitting device 100 that emits light having a correlated color temperature of at least 4500 K but lower than 5500 K, for example, the third phosphor 73 content is at least 0.5 mass percent, preferably at least 1 mass percent, more preferably at least 3 mass percent. Moreover, the third phosphor 73 content is, for example, 10 mass percent at most, preferably 8 mass percent at most.

Setting the third phosphor 73 content in the ranges described above can bring the emission spectrum of the light emitting device 100 in the red region closer to that of the reference light source, thereby further improving the color rendering properties.

Fourth Phosphor 74

The fourth phosphor 74 is a phosphor emitting deep red light that has a peak emission wavelength in a range of from 650 nm to 670 nm and contains a Mn-activated fluorogermanate. The fourth phosphor 74 is preferably at least a type of fluorogermanate having the composition expressed by the formula (4a) or (4b) below. The peak emission wavelength of the phosphor having the composition expressed by the formula (4a) or (4b) is at least 650 nm which is longer than other red light emitting phosphors. Accordingly, the emission spectrum in the long wavelength region can effectively be brought closer to that of the reference light source, and thus the color rendering properties of the light emitting device 100 can be further improved.

$$3.5MgO \cdot 0.5MgF_2 \cdot GeO_2:Mn \quad (4a)$$

$$(x-s)MgO \cdot (s/2)Sc_2O_3 \cdot yMgF_2 \cdot uCaF_2 \cdot (1-t)GeO_2 \cdot (t/2)M^r{}_2O_3:zMn \quad (4b)$$

In the formula (4b), x, y, z, s, t, and u satisfy $2.0 \le x \le 4.0$, $0 < y < 1.5$, $0 < z < 0.05$, $0 \le s < 0.5$, $0 < t < 0.5$, $0 \le u < 1.5$, and further satisfy $y+u < 1.5$. Moreover, the $M^r$ in the formula (4b) above is at least one selected from the group consisting of Al, Ga, and In.

In the formula (4b), preferably, $0.05 \le s \le 0.3$ and $0.05 \le t < 0.3$ are satisfied, which can further improve the luminance. Furthermore, the fourth phosphor 74 preferably has the composition expressed by the formula (4b') below. Accordingly, the light from the light emitting element 10 having the wavelength range which includes the peak emission wavelength, to thereby efficiently excite the fourth phosphor 74.

$$3.4MgO \cdot 0.1Sc_2O_3 \cdot 0.5MgF_2 \cdot 0.885GeO_2 \cdot 0.1Ga_2O_3:0.015Mn \quad (4b')$$

The full width at half maximum in the emission spectrum of the fourth phosphor 74 is, for example, 45 nm at most, preferably 40 nm at most. Setting the full width at half maximum in this range can improve the color purity, to thereby bring the emission spectrum in the red region close to that of the reference light source. This can further improve the color rendering properties of the light emitting device 100. The emission spectrum of the fourth phosphor 74 is such that the average emission intensity in a range of from 600 nm to 620 nm is, for example, 20% at most, more preferably 10% at most, assuming that the maximum emission intensity is 100%. When set on the ranges described above, the emission spectrum of the fourth phosphor 74 barely overlaps the emission spectrum of the third phosphor 73. Thus, the effect of the emission spectrum of the third phosphor 73 can be achieved more efficiently, and thus the color rendering properties can be improved.

In the case of a light emitting device 100 which emits light having, for example, a correlated color temperature of from 2000 K to 7500K, the content of the fourth phosphor 74 relative to the total phosphor content in the phosphor member 50 (i.e., the fourth phosphor content/total phosphor content; hereinafter also simply referred to as "the fourth phosphor 74 content) is, for example, at least 25 mass percent, preferably at least 30 mass percent. Furthermore, the fourth phosphor 74 content is, for example, 50 mass percent at most, preferably 45 mass percent at most, more preferably 40 mass percent at most. The content of the fourth phosphor 74 relative to the entire phosphor member 50 (i.e., mass of the fourth phosphor/mass of the phosphor member) is in a range of from 20 mass percent to 60 mass percent, preferably from 30 mass percent to 55 mass percent.

In the case of a light emitting device 100 which emits light having, for example, a correlated color temperature of from 2500 K to 3500K, the fourth phosphor 74 content is, for example, at least 20 mass percent, preferably at least 30 mass percent. Furthermore, the fourth phosphor 74 content is, for example, 50 mass percent at most, preferably 40 mass percent at most.

In the case of a light emitting device 100 which emits light having, for example, a correlated color temperature of at least 4500 K but lower than 5500 K, the fourth phosphor 74 content is, for example, at least 20 mass percent, preferably at least 30 mass percent. Furthermore, the fourth phosphor 74 content is, for example, 50 mass percent at most, preferably 40 mass percent at most.

Setting the fourth phosphor 74 content in the ranges described above can bring the mission spectrum of the light emitting device 100 in the red region closer to that of the reference light source, thereby improving the color rendering properties.

The phosphor member 50 may include phosphors other than the first phosphor 71 to the fourth phosphor 74 as needed. Such an additional phosphors may include preferably a fifth phosphor 75 that, for example, absorbs the emitted light from the light emitting element 10 and emits blue light. The fifth phosphor 75 is a blue light emitting phosphor having a peak emission wavelength in a range of from 430 nm to 500 nm and containing an Eu-activated alkaline earth phosphate in which Cl is present in the composition. The fifth phosphor 75 preferably has the composition expressed, for example, by the formula (5) below, more preferably the composition expressed by the formula (5') below. This can relatively easily achieve the emission characteristics for the fifth phosphor 75 explained below.

$$(Ca,Sr,Ba)_5(PO_4)_3(Cl,Br):Eu \quad (5)$$

$$Ca_5(PO_4)_3Cl:Eu \quad (5')$$

The maximum excitation wavelength of the fifth phosphor 75, for example, is from 360 nm to 440 nm, preferably from 370 nm to 430 nm. This enables efficient excitation in the peak emission wavelength range of the light emitting element 10 described earlier. The peak emission wavelength of the fifth phosphor 75 is in a range of, for example, from 430 nm to 500 nm, preferably in a range of from 440 nm to 480 nm. With such wavelength ranges in the emission spectrum of the light emitting device 100 particularly in the blue region the emission spectrum of the fifth phosphor 75 is less likely to overlap the emission spectrum of the light emitting element 10 and the emission spectrum of the first phosphor 71. The emission intensity in the blue region is conventionally dependent on the light emitting element. With these wavelength ranges, however, the emission spectrum and the emission intensity in the blue region of the light emitting device 100 can be brought close to those of the reference light source by utilizing the emission spectrum of the first phosphor 71, the emission spectrum of the light emitting element 10, and the emission spectrum of the fifth phosphor 75. This, as a result, can improve the color rendering properties of the light emitting device 100. The full width at half maximum in the emission spectrum of the fifth phosphor 75 is, for example, in a range of from 29 nm to 49 nm, preferably from 34 nm to 44 nm. Setting the full width at half maximum in these ranges can enhance the color purity to thereby bring the emission spectrum in the blue region closer to that of the reference light source, further improving the color rendering properties of the light emitting device 100.

Examples of other phosphors include $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, $K_2(Si,Ti,Ge)F_6:Mn$, and the like. When the phosphor member 50 contains phosphors other than the above-described phosphors, the content is suitably adjusted to achieve the emission characteristics according to the present disclosure. The content of such phosphors relative to the total phosphor content is, for example, 2 mass percent at most, preferably 1 mass percent at most.

Resin Part

Examples of resins used in the resin part of the phosphor member 50 include thermoplastic resins and thermosetting resins. Specific examples of thermosetting resins include epoxy resins, silicone resins, modified silicone resins such as an epoxy modified silicone resin, and the like.

Other Components

The phosphor member 50 may contain other components as needed, in addition to phosphors 70 and resin. Examples of such other components included fillers, such as silica, barium titanate, titanium oxide, and aluminum oxide; light stabilizers; coloring agents, and the like. When the phosphor member contains any of these components, the content can be suitably selected depending on the purpose or the like without being subjected to any particular limitations. In the case of containing a filler as the other component, for example, the content of the filler can be set in a range of from 0.01 to 20 parts by mass relative to 100 parts by mass of the resin 100.

A preferred embodiment of the light emitting device will be explained below.

Figure 3A:
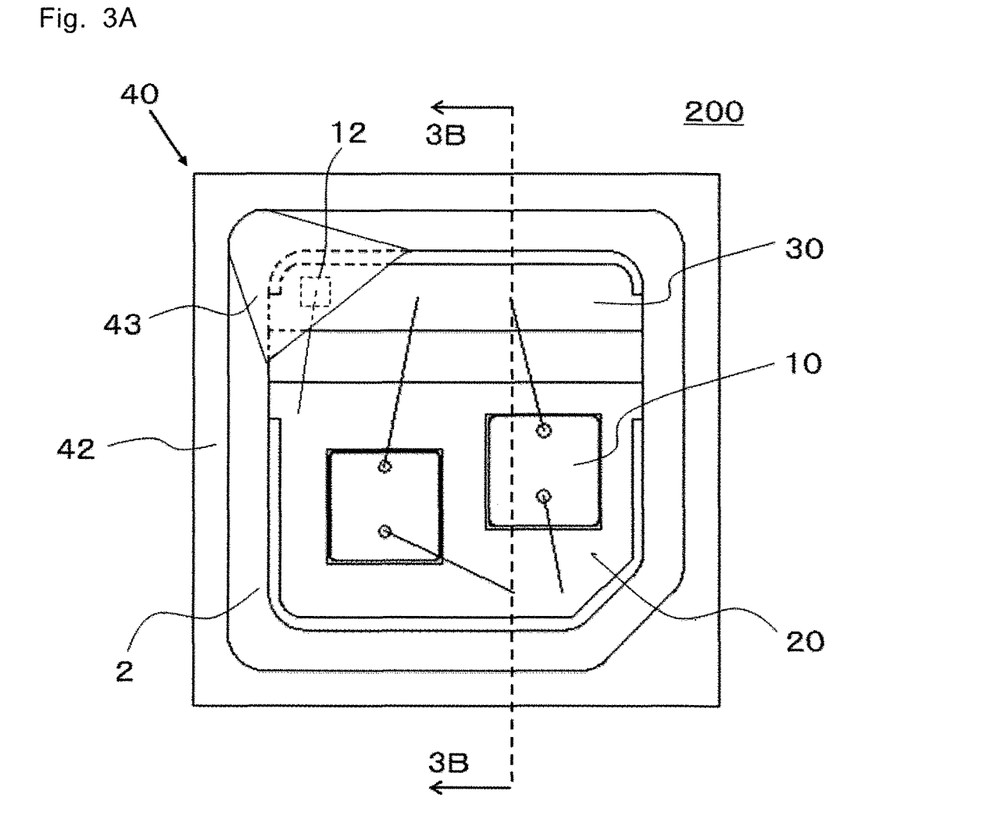
FIG. 3A is a schematic top view of a light emitting device related to the present disclosure.
Figure 3B:
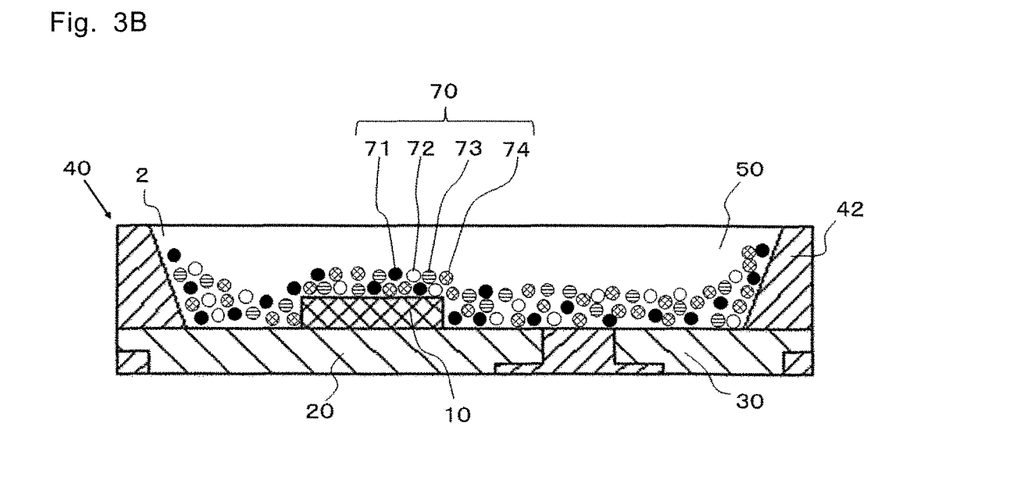
FIG. 3B is a schematic sectional view taken along line 3B-3B in FIG. 3A.

FIG. 3A is a schematic top view of a light emitting device 200 when viewed from the upper face side, and FIG. 3B is a schematic sectional view taken along line 3B-3B in FIG. 3A. In FIG. 3A, the phosphor member 50 and the phosphors 70 are omitted for the purpose of showing the internal structure. The light emitting device 200 includes light emitting elements 10, a package 40 in which the light emitting elements 10 are mounted, and a phosphor member 50 containing phosphors 70. The package 40, which has a first lead 20, a second lead 30, and a resin part 42, has a recess 2 on the upper face side. The light emitting device 200 includes the single phosphor member 50 in the recess 2. The single phosphor member 50 contains four types of phosphors: a first phosphor 71, a second phosphor 72, a third phosphor 73, and a fourth phosphor 74.

The light emitting device 200 can have good color rendering properties when four specific types of phosphors are contained in the single phosphor member 50. In the light emitting device 200, the density of the phosphors 70 contained in the phosphor member 50 is higher at the lower part than the upper part using the upper faces of the light emitting elements 10 as a reference. This allows the phosphors to be distant from the opening of the recess 2, thereby providing a light emitting device having an improved moisture resistance even when phosphors vulnerable to moisture (e.g., MGF phosphors capable of being used as the fourth phosphor 74) are employed.

The light emitting device 200 may further include a protection element 12, such as a Zener diode. This can improve the electrostatic voltage resistance of the light emitting device 200. Furthermore, the protection element 12 is preferably encased in the light reflecting member 43 containing a light reflecting substance such as titanium oxide. This can prevent the light from the light emitting elements 10 from being absorbed by the protection element 12, thereby producing a light emitting device having high light extraction efficiency. The protection element 12 is placed on the bottom face of the recess 2.

Figure 4A:
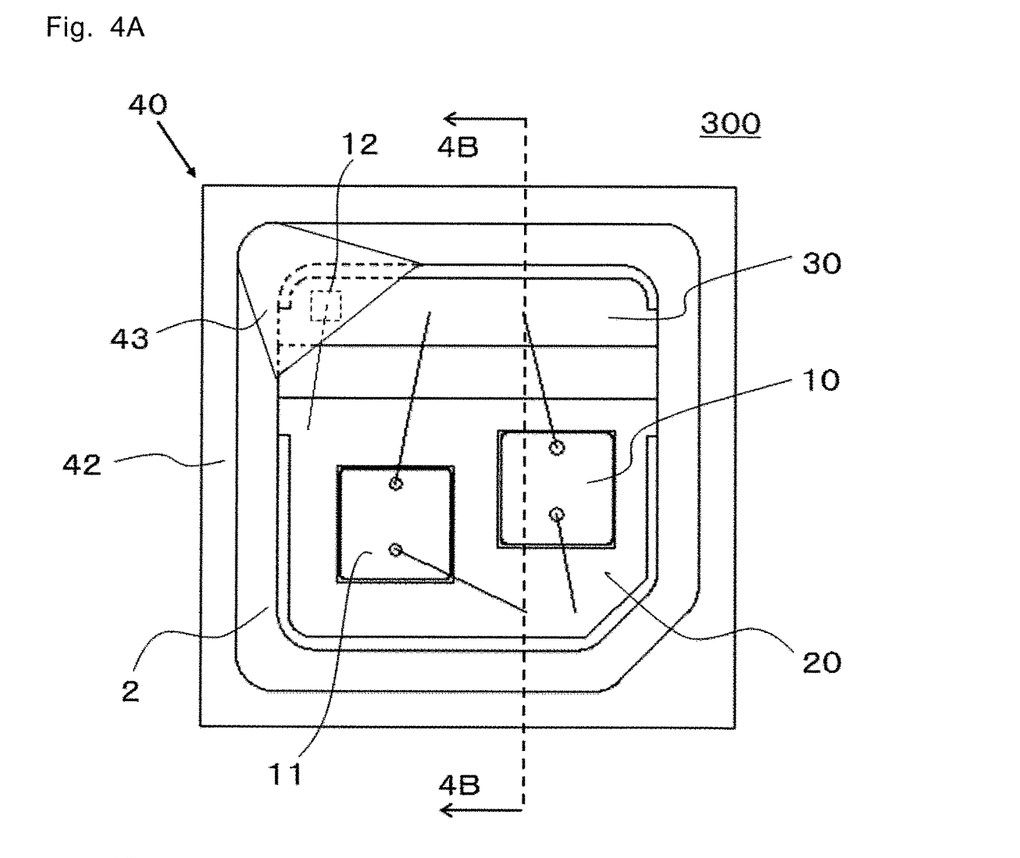
FIG. 4A a schematic top view of a light emitting device according to the present disclosure.
Figure 4B:
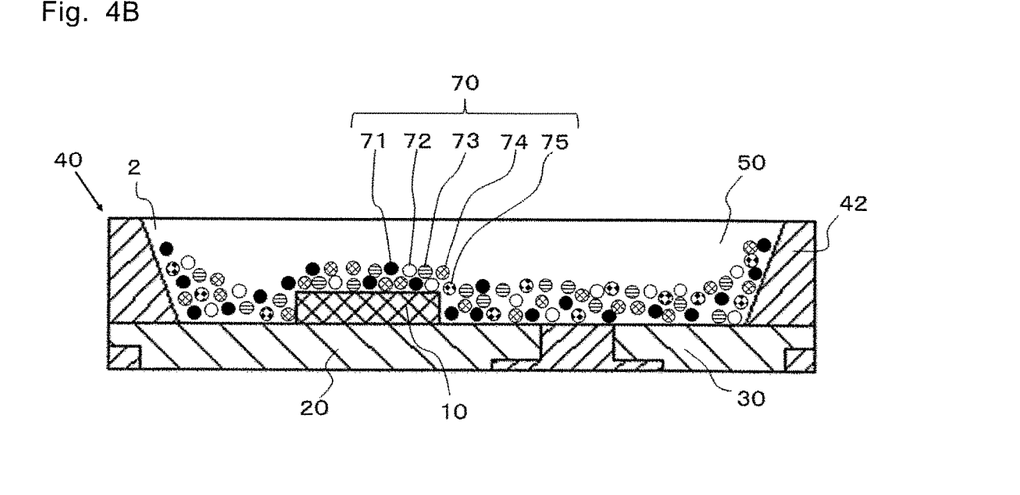
FIG. 4B is a schematic sectional view taken along line 4B-4B in FIG. 4A.

FIG. 4A is a schematic top view of a light emitting device 300 when viewed from the upper face side, and FIG. 4B is a schematic sectional view taken along line 4B-4B in FIG. 4A. The light emitting device 300 is different from the light emitting device 200 by further including a fifth phosphor 75. The fifth phosphor 75 may be a phosphor having a peak emission wavelength in the range of from 440 nm to 460 nm readily excited by the light from the light emitting element or not readily excited by the light from the light emitting element 10. In other words, the fifth phosphor 75 does not have to convert the light from the light emitting element 10 to blue in effect.

In the case of employing a phosphor readily excited by the light from the light emitting element 10 for the fifth phosphor 75, the emission spectrum in the blue region of the light emitting device 100 can be brought closer to that of the reference light source, thereby further enhancing the color rendering properties.

In the case of employing a phosphor not excited or barely excited by the light from the light emitting element 10 for the fifth phosphor 75, it serves the role of mitigating stress in the event that the heat of the light emitting element 10 expands or contracts the phosphor member 50.

As shown in FIG. 4A, moreover, the light emitting device 300 can further include a light emitting element 11 having a different peak emission wavelength from that of the light emitting element 10. The light emitting element 11, for example, has a peak emission wavelength on the shorter wavelength side than that of the light emitting element 10 in a range of from 410 nm to 440 nm. By virtue of the light emitting device 300 including the light emitting elements 10 and 11 having different peak emission wavelengths, the phosphors that are not excited by one light emitting element can be efficiently excited by the other light emitting element. This, as a result, can increase the phosphor options for use as the phosphors 70, thereby easily bringing the emission intensity at each wavelength region closer to that of the reference light source and enhancing the color rendering properties of the light emitting device.

The fifth phosphor 75 preferably is a phosphor having a smaller specific gravity than the first phosphor 71, the second phosphor 72, the third phosphor 73, and the fourth phosphor 74. By using a phosphor having a small specific gravity for the fifth phosphor 75, the fifth phosphor 75 can be positioned in the upper part of the phosphor member 50. This allows the fifth phosphor 75 to reduce the penetration of moisture on the opening side of the recess 2, producing a light emitting device with improved moisture resistance even when phosphors vulnerable to moisture (e.g., MGF phosphors capable of being used as the fourth phosphor 74) are employed. Moreover, when the fifth phosphor 75 is a phosphor easily degraded by light, it can be distanced from the light emitting element 10, thereby producing a highly reliable light emitting device.

Figure 5:
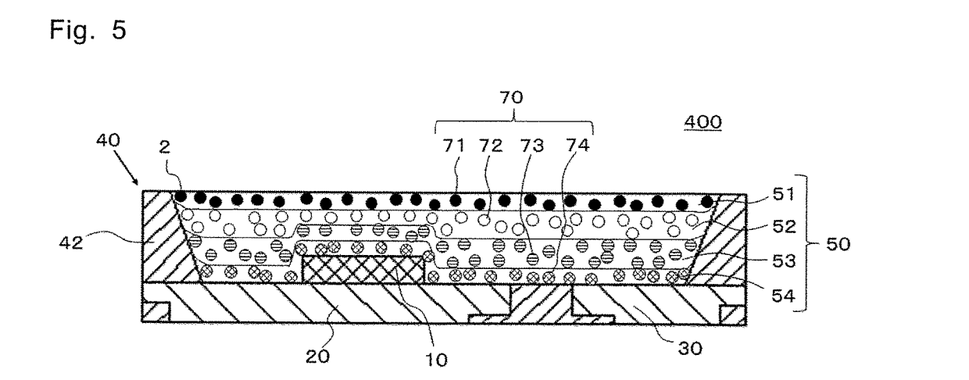
FIG. 5 is a schematic sectional view of a light emitting device according to the present disclosure.

FIG. 5 is a schematic sectional view of a light emitting device 400. The light emitting device 400 has a light emitting element 10, a package 40 in which the light emitting element 10 is mounted, and a phosphor member 50. The phosphor member 50 includes a first layer 51 containing a first phosphor 71, a second layer 52 containing a second phosphor 72, a third layer 53 containing a third phosphor 73, and a fourth layer 54 containing a fourth phosphor 74. By constructing the phosphor member 50 with multiple layers, phosphors being individually contained in the layers, the first phosphor 71 to the fourth phosphor 74 can easily be arranged to have preferable positional relationships. In the light emitting device 400 shown in FIG. 5, the first layer 51 to the fourth layer 54 are disposed on or above the light emitting element 10 in the order of the fourth layer 54, the third layer 53, the second layer 52, and the first layer 51 from the upper face of the light emitting element 10. In other words, the phosphor layers are arranged so that one emitting light having a long wavelength is disposed in the vicinity of the light emitting element 10, and those emitting light having shorter wavelengths are disposed as they become more distant from the light emitting element 10. This can reduce absorption of light between phosphors, thereby producing a light emitting device having high light extraction efficiency. Even if a phosphor vulnerable to moisture (e.g., MGF phosphor) is employed as the fourth phosphor 74, the fourth layer 54 containing the fourth phosphor 74 can be positioned distant from the opening of the recess 2. Thus, a light emitting device with improved moisture resistance can be produced. Although one type of phosphor is contained per layer in the light emitting device 400 shown in FIG. 5, the arrangement is not limited to this, and two or more types of phosphors may be contained in one phosphor layer.

Figure 6:
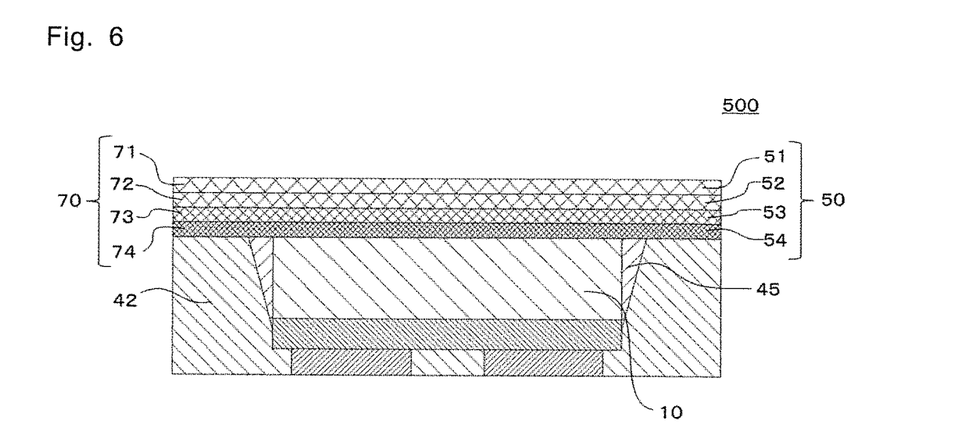
FIG. 6 is a schematic sectional view of a light emitting device according to the present disclosure.

FIG. 6 is a schematic sectional view of a light emitting device 500. The light emitting device 500 has a light emitting element 10, a light transmissive member 45 disposed on the lateral faces of the light emitting element 10, a resin part 42 covering the exterior of the light transmissive member 45, and a phosphor member 50 on the upper face side that functions as the emission face of the light emitting device 500. The resin part 42 contains a light reflecting substance, such as titanium oxide. The phosphor member 50 includes a first layer 51 containing a first phosphor 71, a second layer 52 containing a second phosphor 72, a third layer 53 containing a third phosphor 73, and a fourth layer 54 containing a fourth phosphor 74. By including a light emitting element 10 having a specific peak emission wavelength and four specific types of phosphors, the emission spectrum of the light emitting device 500 can be brought close to the spectrum of the reference light source. Furthermore, by constructing the phosphor member 50 with multiple layers, each type of phosphors being individually contained in the layers, the first phosphor 71 to the fourth phosphor 74 can easily be arranged to have preferable positional relationships. In the light emitting device 500, two or more phosphors may be contained in one phosphor layer, or the phosphor member 50 may be constructed with a single layer while containing at least four types of phosphors in the single phosphor member 50.

Figure 7:
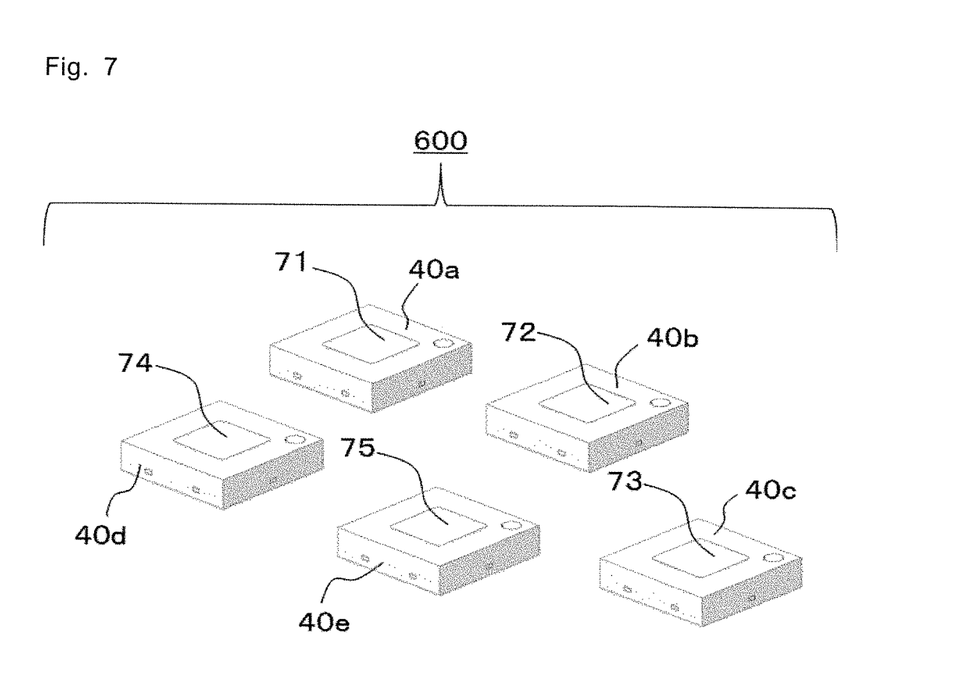
FIG. 7 is a schematic perspective view of a light emitting device according to the present disclosure.

FIG. 7 is a schematic perspective view of a light emitting device 600 which has multiple packages 40. The light emitting device 600 includes a plurality of packages 40, light emitting elements 10, and first to fourth phosphors 71 to 74. In the light emitting device 600 shown in FIG. 7, the first phosphor 71 is included in the first package 40a, the second phosphor 72 is included in the second package 40b, the third phosphor 73 is included in the third package 40c, the fourth phosphor 74 is included in the fourth package 40d, and the fifth phosphor 75 is included in the fifth package 40e. By constructing the light emitting device 600 with multiple packages and disposing each phosphor in each package, the absorption of light between phosphors can be reduced. As a result, a light emitting device having high light extraction efficiency can be provided. In the light emitting device 600 shown in FIG. 7, one of the phosphors is disposed in one of the packages, but the arrangement is not limited to this. Two or more phosphors may be disposed in one package.

The light emitting devices according to the present disclosure can be utilized as light sources for lighting fixtures, LED display, camera flashlights, liquid crystal backlights, and the like, employing a blue light emitting diode as an excitation light source and having good emission properties. Particularly, these can be suitably utilized as light sources in medical applications, lighting fixtures for art, and for color comparison purposes.

What is claimed is:

1. A light emitting device, comprising:
   a light emitting element having a peak emission wavelength in a range of from 440 nm to 460 nm, and a phosphor member, wherein
the phosphor member contains:
a first phosphor having a peak emission wavelength in a range of from 440 nm to 550 nm and comprising at least one selected from the group consisting of an Eu-activated alkaline earth aluminate and an Eu-activated silicate containing Ca, Mg, and Cl,
a second phosphor having a peak emission wavelength in a range of from 500 nm to 600 nm and comprising a Ce-activated rare earth aluminate,
a third phosphor having a peak emission wavelength in a range of from 610 nm to 650 nm and comprising an Eu-activated silicon nitride containing Al and at least one selected from the group consisting of Sr and Ca, and
a fourth phosphor having a peak emission wavelength in a range of from 650 nm to 670 nm and comprising a Mn-activated fluorogermanate, and
wherein a content of the first phosphor relative to the entire phosphor member is in a range of from 10 mass percent to 50 mass percent, a content of the second phosphor relative to the entire phosphor member is in a range of from 10 mass percent to 80 mass percent, a content of the third phosphor relative to the entire phosphor member is in a range of from 1 mass percent to 15 mass percent, and a content of the fourth phosphor relative to the entire phosphor member is in a range of from 20 mass percent to 60 mass percent.

2. The light emitting device according to claim 1 further comprising,
a fifth phosphor having a peak emission wavelength in a range of from 430 nm to 500 nm and comprising an Eu-activated alkaline earth phosphate containing Cl.

3. The light emitting device according to claim 1, wherein
the first phosphor is contained in a first layer,
the second phosphor is contained in a second layer,
the third phosphor is contained in a third layer,
the fourth phosphor is contained in a fourth layer, and
the first layer to the fourth layer are arranged in a stack.

4. The light emitting device according to claim 3, wherein
the first layer to the fourth layer are disposed on or above the light emitting element, and
the layers are disposed in the order of the fourth layer, the third layer, the second layer, and the first layer from an upper face of the light emitting element.

5. The light emitting device according to claim 1, wherein
the light emitting device includes a plurality of packages, and
the first phosphor to the fourth phosphor are disposed in any of the plurality of packages.

6. The light emitting device according to claim 1, wherein the light emitting device emits light having a correlated color temperature in a range of from 2500 K to 3500 K, and a ratio of a peak emission intensity of the first phosphor to a peak emission intensity of the light emitting element in an emission spectrum is from 0.9 to 1.15.

7. The light emitting device according to claim 1, wherein the light emitting device emits light having a correlated color temperature in a range of from 4500 K to 5500 K, and a ratio of a peak emission intensity of the first phosphor to a peak emission intensity of the light emitting element in an emission spectrum is 0.6 at most.

8. The light emitting device according to claim 1, wherein the light emitting device emits light having a correlated color temperature in a range of from 2500 K to 5500 K, and a ratio of a peak emission intensity of the first phosphor to a peak emission intensity of the light emitting element at a lowest part of the peak emission intensity in a region between the peak emission wavelength of the light emitting element and the peak emission wavelength of the first phosphor in an emission spectrum is from 0.2 to 0.27.

9. The light emitting device according to claim 1, wherein the first phosphor comprises at least one selected from the group consisting of an alkaline earth aluminate represented by formula (1a) and a silicate represented by formula (1b):

$$(Sr,Ca,Ba)_4Al_{14}O_{25}:Eu \quad (1a)$$

$$(Ca,Sr,Ba)_8MgSi_4O_{16}(F,Cl,Br)_2:Eu \quad (1b).$$

10. The light emitting device according to claim 1, wherein the second phosphor comprises a rare earth aluminate represented by formula (2):

$$(Y,Lu,Gd)_3(Al,Ga)_5O_{12}:Ce \quad (2).$$

11. The light emitting device according to claim 1, wherein the third phosphor comprises a silicon nitride represented by formula (3):

$$(Sr,Ca)AlSiN_3:Eu \quad (3).$$

12. The light emitting device according to claim 1, wherein the fourth phosphor comprises a fluorogermanate represented by formula (4a) or formula (4b):

$$3.5MgO.0.5MgF_2.GeO_2:Mn \quad (4a)$$

$$(x-s)MgO.(s/2)Sc_2O_3.yMgF_2.uCaF_2.(1-t)GeO_2.(t/2)M'_2O_3:zMn \quad (4b),$$

wherein M' in the formula is at least one selected from the group consisting of Al, Ga, and In; and x, y, z, s, t, and u satisfy 2≤x≤4, 0<y<1.5, 0<z<0.05, 0≤s<0.5, 0<t<0.5, and 0≤u<1.5, respectively.

13. The light emitting device according to claim 1, wherein a special color rendering index R12 of the light emitting device is at least 90.

14. The light emitting device according to claim 1, wherein a sum of special color rendering indexes R9 to R15 of the light emitting device is at least 600.

15. The light emitting device according to claim 1, wherein the first phosphor comprises at least one selected from the group consisting of an alkaline earth aluminate represented by formula (1a) and a silicate represented by formula (1b), $$(Sr,Ca,Ba)_4Al_{14}O_{25}:Eu \quad (1a)$$

$$(Ca,Sr,Ba)_8MgSi_4O_{16}(F,Cl,Br)_2:Eu \quad (1b),$$

the second phosphor comprises a rare earth aluminate represented by formula (2), $$(Y,Lu,Gd)_3(Al,Ga)_5O_{12}:Ce \quad (2),$$

the third phosphor comprises a silicon nitride represented by formula (3), $$(Sr,Ca)AlSiN_3:Eu \quad (3),$$

and the fourth phosphor comprises a fluorogermanate represented by formula (4a) or formula (4b), $$3.5MgO.0.5MgF_2.GeO_2:Mn \quad (4a)$$

$$(x-s)MgO.(s/2)Sc_2O_3.yMgF_2.uCaF_2.(1-t)GeO_2.(t/2)M'_2O_3:zMn \quad (4b),$$

wherein M' in the formula is at least one selected from the group consisting of Al, Ga, and In; and x, y, z, s, t, and u satisfy 2≤x≤4, 0<y<1.5, 0<z<0.05, 0≤s<0.5, 0<t<0.5, and 0≤u<1.5, respectively.

16. The light emitting device according to claim 15 further comprising,
a fifth phosphor having a peak emission wavelength in a range of from 430 nm to 500 nm and comprising an Eu-activated alkaline earth phosphate containing Cl.

17. The light emitting device according to claim 15, wherein the light emitting device emits light having a correlated color temperature in a range of from 2500 K to 3500 K, and a ratio of a peak emission intensity of the first phosphor to a peak emission intensity of the light emitting element in an emission spectrum is from 0.9 to 1.15.

18. The light emitting device according to claim 15, wherein the light emitting device emits light having a correlated color temperature in a range of from 4500 K to 5500 K, and a ratio of a peak emission intensity of the first phosphor to a peak emission intensity of the light emitting element in an emission spectrum is 0.6 at most.

19. The light emitting device according to claim 15, wherein the light emitting device emits light having a correlated color temperature in a range of from 2500 K to 5500 K, and a ratio of a peak emission intensity of the first phosphor to a peak emission intensity of the light emitting element at a lowest part of the peak emission intensity in a region between the peak emission wavelength of the light emitting element and the peak emission wavelength of the first phosphor in an emission spectrum is from 0.2 to 0.27.

20. The light emitting device according to claim 15, wherein a special color rendering index R12 of the light emitting device is at least 90.

\* \* \* \* \*